United States Patent [19]

Uchida et al.

[11] 4,011,576
[45] Mar. 8, 1977

[54] NONVOLATILE SEMICONDUCTOR MEMORY DEVICES

[75] Inventors: Yukimasa Uchida, Yokohama; Takeshi Matsuo, Yokosuka, both of Japan

[73] Assignee: Tokyo Shibaura Electric Company, Ltd., Japan

[22] Filed: Aug. 25, 1975

[21] Appl. No.: 607,711

[30] Foreign Application Priority Data

Aug. 28, 1974 Japan .............................. 49-98553

[52] U.S. Cl. .................................... 357/23; 357/54
[51] Int. Cl.² ................... H01L 29/78; H01L 29/34
[58] Field of Search ............................. 37/23, 54

[56] References Cited

UNITED STATES PATENTS

| | | |
|---|---|---|
| 3,747,203 | 7/1973 | Shannon .............................. 357/23 |
| 3,845,327 | 10/1974 | Cricchi ................................ 357/23 |

*Primary Examiner*—Edward J. Wojciechowicz
*Attorney, Agent, or Firm*—Oblon, Fisher, Spivak, McClelland & Maier

[57] ABSTRACT

A nonvolatile semiconductor memory device of the type known as an insulated gate field effect transistor, in which a thick gate insulating layer overlaps the source and drain regions formed in a substrate. The surface of the substrate underlying the thick gate insulating layer is doped lightly with impurities having opposite conductivity relative to the substrate.

6 Claims, 19 Drawing Figures

NONVOLATILE SEMICONDUCTOR MEMORY DEVICES

BACKGROUND OF THE INVENTION

1. Field of the Invention

This invention relates generally to the field of semiconductor memory devices, and more particularly to nonvolatile semiconductor memory devices of the type known as insulated gate field effect transistors (IGFETS).

2. Description of the Prior Art

In the semiconductor arts, nonvolatile semiconductor memory devices including MIS (metal insulator semiconductors) and MIOS (metal insulator oxide semiconductor) structures are widely used. Typical examples of these types of storage devices in the nonvolatile semiconductor memories have MNOS (metal nitride oxide semiconductor) structures. The structure takes the form of a silicon substrate having a source and drain formed therein separated by a channel having a gate spaced between the source and drain and spaced above the channel by a combined silicon dioxide-silicon nitride layer. Carriers such as electrons injected through the insulator layer from the substrate are trapped near the interface of the silicon dioxide and silicon nitride layers. The carriers trapped at the interface will be retained nonvolatilely for several years or more.

In the above mentioned MNOS device the thickness of the silicon dioxide layer is about 20 angstroms and the layer overlaps the source and drain junctions, so the avalanche breakdown voltage of the drain relative to the substrate is lowered. Moreover the breakdown voltage between the source (or drain) and gate is lowered.

To solve this problem an improved MNOS device is disclosed in an article entitled "The drain source protected MNOS memory device and memory endurance" published 1973 IEDM pp. 126–128. Here a thicker gate oxide layer overlaps the source and drain, thus the breakdown voltage between the source (or drain) and gate is improved. However in this device, which exhibits a bivalued threshold voltage, the voltage difference between the low and high threshold values is small, causing the error in reading out the stored threshold value.

SUMMARY OF THE INVENTION

Accordingly, one object of this invention is to provide an improved nonvolatile semiconductor memory of the IGFET type.

A further object of the invention is to provide an improved nonvolatile semiconductor memory which exhibits a bivalued threshold voltage.

Another object of the invention is to provide a nonvolatile, two threshold voltage IGFET.

Briefly, these and other objects of the invention are achieved by forming an IGFET with a thicker gate insulating layer overlapping the source and drain regions, and by light doping of the surface of the substrate under the thicker gate insulating layer with a material of opposite conductivity type with respect to the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
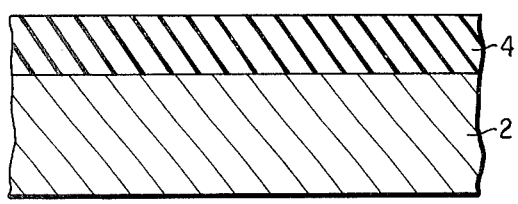
FIGS. 1a through 1o are cross-sectional views of a portion of a device in various stages of fabrication.

Referring now to the drawings, wherein like reference numerals designate identical or corresponding parts throughout the several views, and more particularly to FIGS. 1a through 1o thereof, the fabrication of a nonvolatile semiconductor will now be described. The invention is concerned primarily with the nonvolatile semiconductor memory transistor such as MNOS, MIOS, MIS etc. transistors. However, first the fabrication process will be expalined.

Figure 1B:
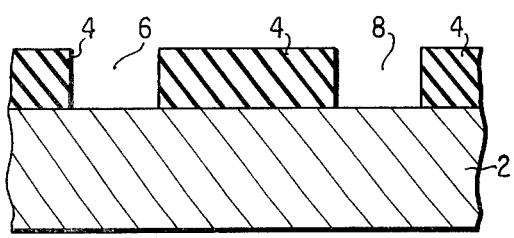
Figure 1C:
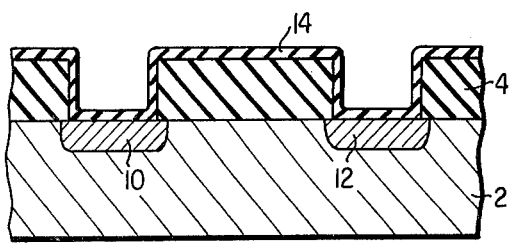
Figure 1D:
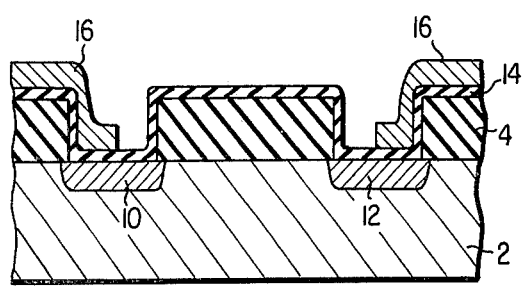

FIG. 1a shows an n-type (III) oriented silicon semiconductor substrate 2 having an $SiO_2$ insulating layer 4 thereon. In this structure openings 6 and 8 are first formed by conventional techniques, as shown in FIG. 1b. A source 10 and drain 12 are then formed by conventional techniques and an additional $SiO_2$ layer 14 is formed, as shown in FIG. 1c. Subsequently, a photoresist 16 is added, as shown in FIG. 1d. All these steps are conventional and need not be described in detail.

Figure 1E:
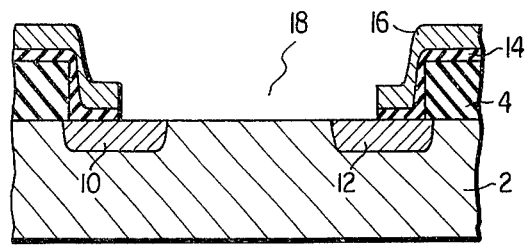

A shown in FIG. 1e, a central portion of the $SiO_2$ layer 4 is then removed, exposing a portion of the surface 18 of the silicon substrate 2.

Figure 1F:
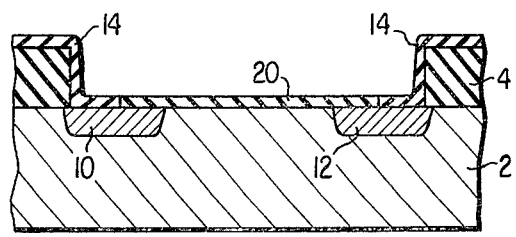

Thereafter the photoresist 16 is removed and an insulating layer 20, of $SiO_2$ for example, is formed on the exposed surface 18 (FIG. 1f). The $SiO_2$ layer may be formed by a standard oxidation process. The thickness of the $SiO_2$ layer 20 is, for example, 1150 angstroms.

Figure 1G:
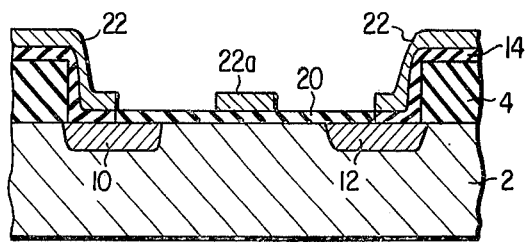

Thereafter as shown in FIG. 1g a photoresist 22 is applied on the selected portion of the entire surface of the $SiO_2$ layers 14 and 20 by conventional photomasking techniques. The photoresist applied between the source 10 and drain 12, namely the portion 22a, has a width of 10 microns. The photoresist 22 may be used as a mask for ion implantation. The thickness of the photoresist 22, 22a is several microns.

Figure 1H:
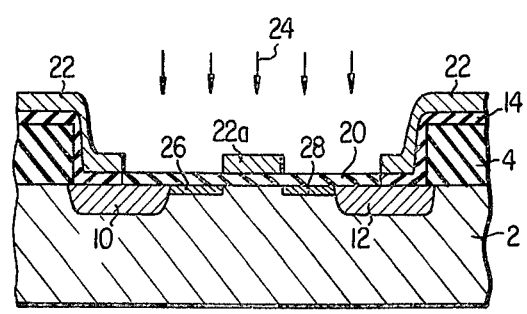
Figure 1I:
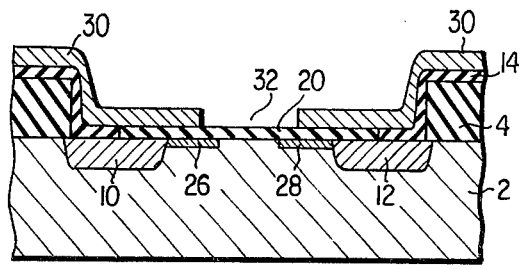
Figure 1J:
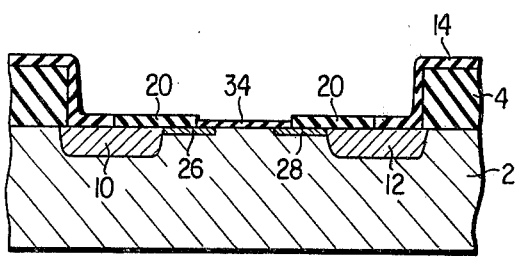
Figure 2:
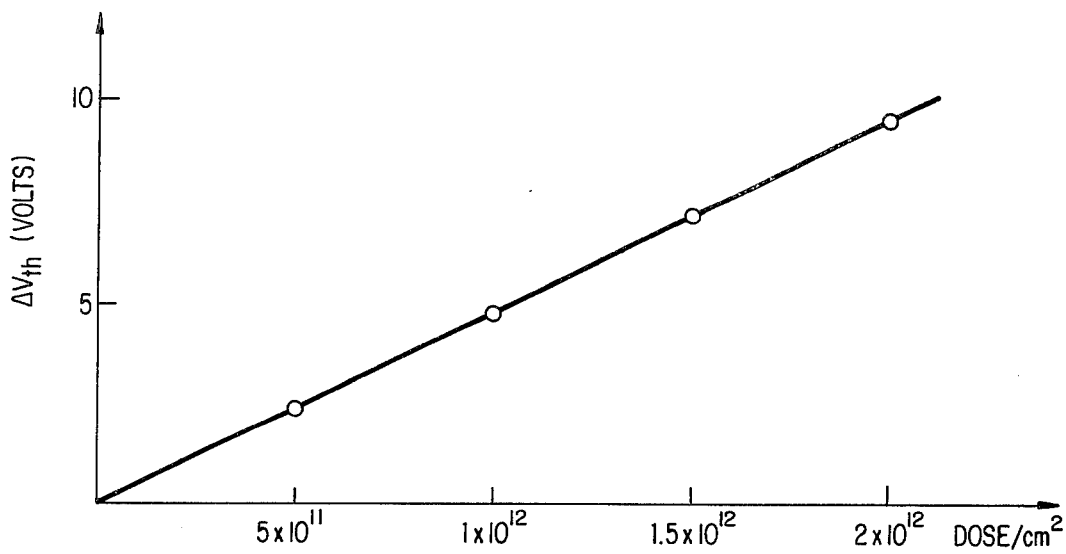
FIG. 2 is a plot of a threshold voltage shift versus dose quantity.

The next step is the ion implantation process during which the entire surface is exposed to the impurity ions 24, such as boron ions for example (FIG. 1h). The impurity ions are chosen so as to give opposite conductivity to the Si substrate 2. The boron ions 24 are accelerated with an energy of ~ 40 keV. The dose quantity of the boron ions penetrating the Si substrate 2 is approximately $1.5 \times 10^{12}$ boron ions/cm$^2$. The channel dose quantity is determined so as to get the desired threshold voltage shift. One example of the plot of threshold voltage shift vesus dose quantity is shown in FIG. 2, where the thickness of the oxide layer is 1150 angstroms.

Thereafter the photoresist 22, 22a used in the ion implantation process is removed and another photoresist layer 30 is selectively deposited over the SiO₂ layers 14 and 20 as shown in FIG. 1 i. The photoresist 30 does not cover the region between the doped regions 26 and 28. The typical width of the uncovered region 32 is 18 microns.

Thereafter the uncovered portion of the gate oxide 20 is removed by conventional etching techniques, thus the Si surface is exposed. After the removal of the photoresist 30, a very thin oxide layer 34 is formed on the exposed Si surface (FIG. 1 j). The thickness of the oxide layer 34 is about 20 angstroms. The layer 34 may be formed by heating the Si substrate 2 in an oxidizing atmosphere at 600° C. Carriers may pass through the layer 34 by tunnelling.

Figure 1K:
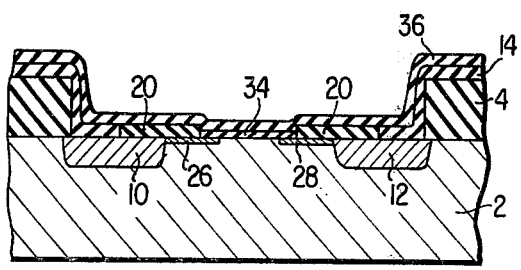
Figure 1L:
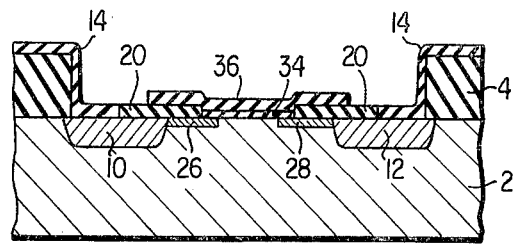

Thereafter, as shown in FIG. 1k, another insulating layer 36 is deposited over the entire surface. Typical material of the insulating layer 36 is silicon nitride, alumina etc. The silicon nitride layer 36 is formed by the pyrolytic decomposition of silane and ammonia at about 800° C and the thickness of the layer is approximately 500 angstroms although the thickness of the layer may be within the range of 400–1000 angstroms.

The silicon nitride layer 36 may be patterned by standard photomasking and etching techniques as shown in FIG. 1e. The etching is carried out by using hot phosphoric acid. The solvent does not significantly attack SiO₂, thus permitting controlled etching of the silicon nitride layer 36. The silicon nitride layer 36 covers the very thin oxide layer 34. Carriers, such as electrons, may be trapped at or near the interface of the silicon nitride layer 36 and the oxide layer 34.

Figure 1M:
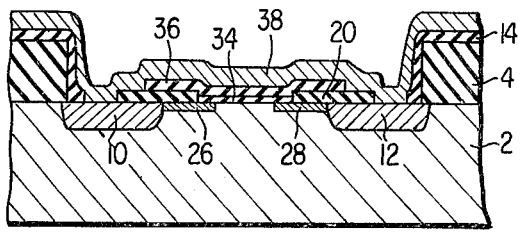

Next step is the application of a conductive layer 38 over the entire surface as shown in FIG. 1m. One typical material for the conductive layer 38 is aluminum. The layer 38 is formed by evaporating metal aluminum.

Figure 1N:
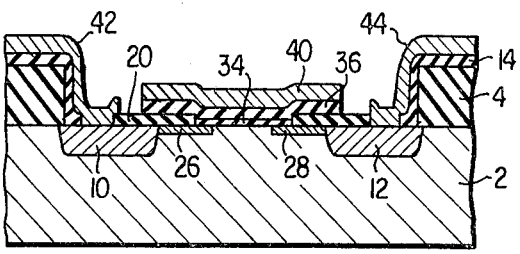
Figure 1O:
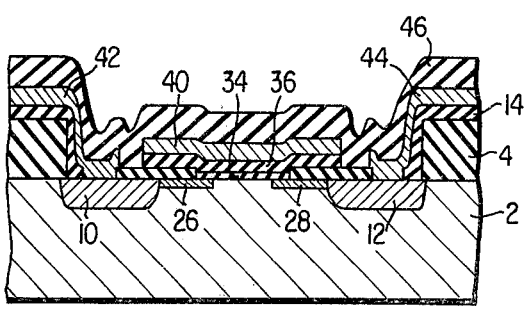

The electrodes and interconnections are formed by standard photoresist and etch techniques as shown in FIG. 1n. The reference numerals 40, 42 and 44 indicate the gate electrode, the source electrode and the drain electrode, respectively.

The next step is a passivation process. A SiO₂ layer 46 is deposited on the whole surface. The SiO₂ layer 46 is formed by conventional chemical Vapour Deposition techniques. The thickness of the layer 46 is 10,000 angstroms. The layer 46 is provided for the passivation of the device. The bonding portions of the electrodes 40, 42 and 44 are not covered by the SiO₂ layer 46 although the uncovered portion is not shown in the figure.

After the passivation step, the device structure is complete.

Figure 3:
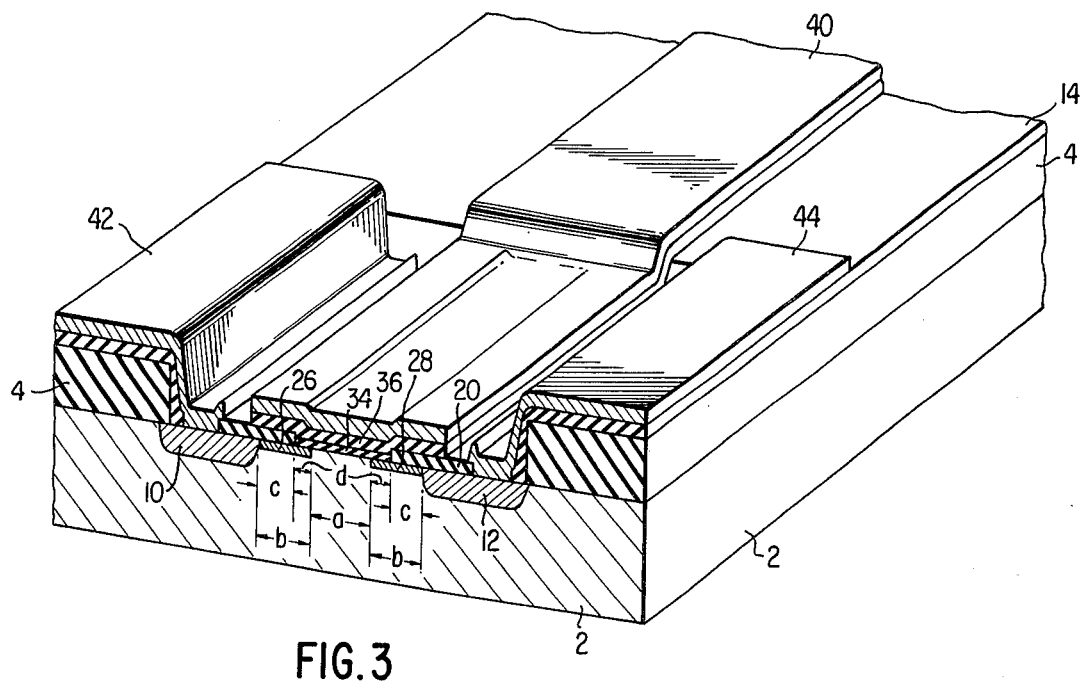
FIG. 3 is a perspective view of the completed device in accordance with the invention.

Referring to FIG. 3, the device as it exists in FIG. 1n is shown in a simplified perspective view. The device shown comprises an n-type (III) oriented Si substrate 2 containing p-type diffused regions 10 and 12 with additional impurity doped regions 26 and 28. A thicker SiO₂ layer 20 overlies diffused regions 10 and 12. The thicker SiO₂ layer 20 also overlies a portion of the impurity doped regions 26 and 28. A thinner SiO₂ layer 34 overlies the region between the doped regions 26 and 28 and also overlies a portion of the impurity doped regions 26 and 28. The important thing is that the thickness of the SiO₂ layer changes over the doped regions 26 and 28. In FIG. 3 a denotes the region between the doped regions 26 and 28, b denotes the doped regions 26 and 28, c denotes the portion of the doped regions 26 and 28 which underly the thicker SiO₂ layer 20, and d denotes the portion of the doped regions 26 and 28 which underly the very thin SiO₂ layer 34.

The memory part of the device consists of the Si substrate 2, the gate oxide layer 34 and layer 20, the silicon nitride layer 36 and the gate electrode 40.

The region denoted by a is the actual memory part. Here the thickness of the very thin oxide layer 34 and the silicon nitride layer 36 are 20 angstroms and 500 angstroms, respectively. The thickness may vary from about 10 angstroms to several hundreds of angstroms. According to the thickness of the SiO₂ layer 34, direct tunnelling hysteresis, Fowler-Nordheim tunnelling hysteresis and reverse hysteresis have been observed to occur. The MNOS transistor in a region has a bivalued threshold voltage and exhibits usual hysteresis characteristics. The setting of the threshold voltage (writing and erasing) is performed as follows. Pulses which have a peak pulse height +25 volts and pulse width of 1 msec are applied to the gage electrode 40, (the silicon substrate, the source and the drain are grounded) to thus set the threshold voltage of the MNOS transistor to +2 volts (0 state or erasing). To alter the threshold voltage of the MNOS transistor, −25 volt pulses (1 msec in pulse width) are applied to the gate electrode 40 with the silicon substrate and the drain grounded. Then the threshold voltage is altered to −6 volts (1 state or writing).

Next the memory characteristics of the MNOS structure in the d region is explained. The MNOS transistor in d region has a bivalued threshold voltage, namely +4 volts (0 state) and −4 volts (1 state). The transistor has a higher threshold voltage than the transistor in a region and thus the combined hysteresis characteristics of the a and d regions is just like that of the a region.

Referring to the c region, the thickness of the SiO₂ layer 20 is 1000 angstroms. Hysteresis characteristics are not observed in this region. The threshold voltage of this part is +5 volts.

Figure 4:
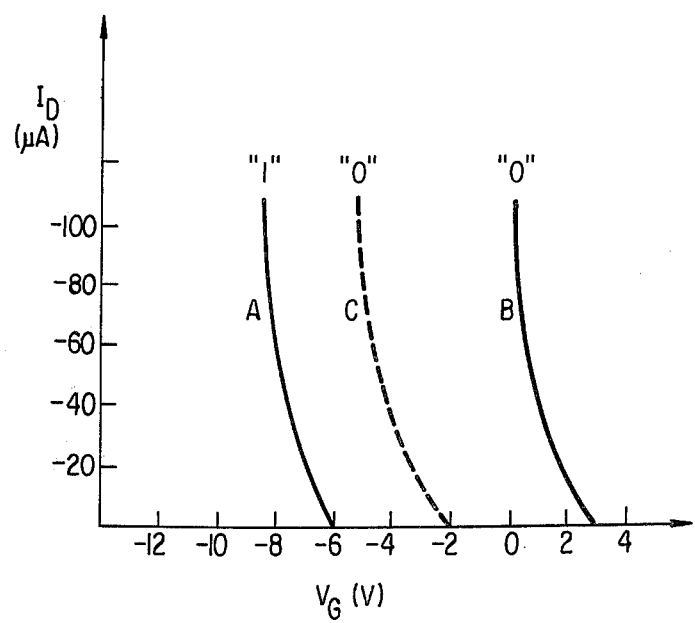
FIG. 4 is a diagram showing the hysteresis characteristics of the device shown in FIG. 3.

The total hysteresis characteristics of the MNOS device in the a, d, c regions may be explained in view of FIG. 4. Referring to FIG. 4, the 0 state (denoted by B) and the 1 state (denoted by A) of the device shown in FIG. 3 are illustrated. The difference in threshold voltages is approximately 8 volts. Without the doped regions 26 and 28, the 0 state (denoted by C) may be as the dotted line in FIG. 4. This is because enhancement mode MOS transistors are connected to the actual memory part in series. Thus the difference in threshold voltages becomes small, for example, 3–4 volts.

Next reading out of the memory device in accordance with the invention is explained. To read out the stored information the Si substrate 2 and the source 10 are grounded and a negative voltage, for example −5 volts, is applied to the drain 12. Then a reading out voltage, for example −4 volts is applied to the gate electrode 40. When the memory state is 0, current flows in the a region. When the memory state is 1, current does not flow in the a region, thus enabling the reading of the stored information.

In the preceeding description the source region 10 (or the drain region 12) and the doped region 26 (or 28) are dealt with as different regions. However, the source region 10 together with the doped region 26 effectively work as one source region. The effective channel region exists in the a region and the mutual conductance become large.

Alternatively, erasing of the device may be performed as follows. Minus 20 volts is applied to the source and the drain, and the substrate is grounded. Then +25 volts is applied to the gate electrode. In this type of erasing, the surface avalanche breakdown voltage of the source and gate become high because of the existence of the doped regions 26 and 28.

Figure 5:
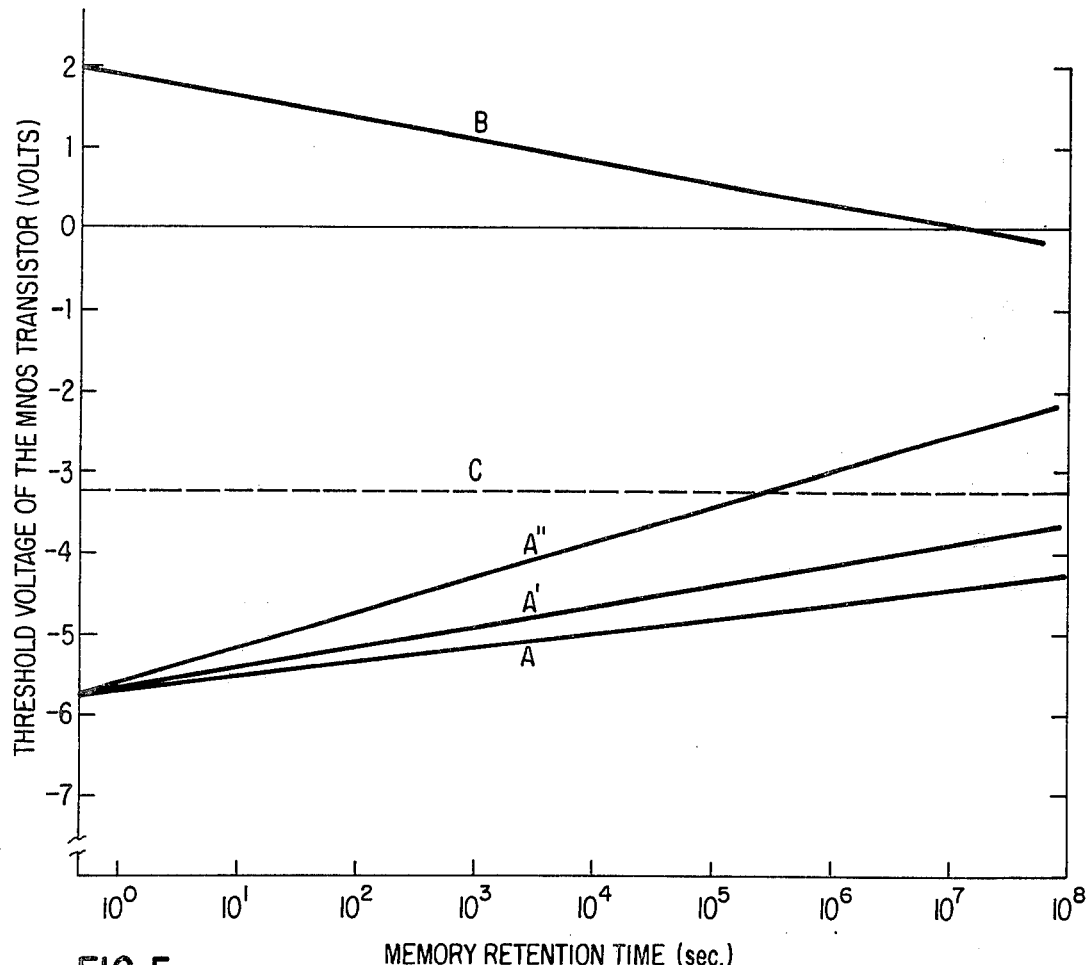
FIG. 5 is a diagram explaining memory retention characteristics of the device in accordance with the invention.

Referring to FIG. 5 the memory retention characteristics is explained. In FIG. 5A, B, C, have the same meaning as in FIG. 4. FIG. 5 shows how the initial threshold voltage changes in accordance with time. Writing and erasing of $10^4$ cycles and $10^5$ cycles are performed for the device denoted by A' and A'' respectively (cycle time 1 sec). To determine the memory state, a voltage difference of 1 volt is needed from the reliability point of view. Thus for the device denoted by A'', actual memory retention time may be about $10^3$ second. On the other hand, in the memory device in accordance with the present invention, even after $10^5$ cycles of writing and erasing, the memory retention time is more than $10^8$ seconds (several years or more), thus enabling the device of the present invention to provide nonvolatile memory devices.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A nonvolatile semiconductor memory device comprising:
   spaced apart source and drain regions of one conductivity type within a semiconductor substrate of the other conductivity type;
   first and second spaced apart lightly doped regions of the same conductivity type as said source and drain regions, and formed within the semiconductor substrate in between said source and drain regions, said first lightly doped region contacting said source region, and said second lightly doped region contacting said drain region;
   a first insulating layer formed on the semiconductor substrate, said first insulating layer consisting of a thicker part and a very thin part, said thicker part overlying said source and drain regions and part of said lightly doped regions and said thin part overlying the area between said lightly doped regions and the rest of said lightly doped regions;
   a second insulating layer applied on said first insulating layer; a gate electrode applied on said second insulating layer; and source and drain electrodes connected to said source and drain regions.

2. A nonvolatile semiconductor memory device as in claim 1, wherein:
   said semiconductor substrate is silicon and said first insulating layer is silicon dioxide.

3. A nonvolatile semiconductor memory device as in claim 2, wherein: said second insulating layer is silicon nitride.

4. A nonvolatile semiconductor memory device as in claim 2, wherein:
   the thickness of said very thin part of said first insulating layer ranges from 10 to 50 angstroms and the thickness of said thicker part of said first insulating layer ranges from 500 to 1500 angstroms.

5. A nonvolatile semiconductor memory device as in claim 3, wherein:
   the thickness of said silicon nitride layer ranges from 300 to 1000 angstroms.

6. A nonvolatile semiconductor memory device as in claim 2, wherein:
   said semiconductor substrate is n-type (111) oriented silicon.

* * * * *